United States Patent
Imai et al.

(10) Patent No.: US 7,745,796 B2
(45) Date of Patent: Jun. 29, 2010

(54) PLANAR RADIATION DETECTOR USING RADIATION-INDUCED-CHARGE CONVERSION FILM OF AMORPHOUS SELENIUM

(75) Inventors: Shinji Imai, Ashigarakami-gun (JP); Tomomasa Sato, Minamiashigara (JP)

(73) Assignees: FUJIFILM Corporation, Tokyo (JP); Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/046,088

(22) Filed: Mar. 11, 2008

(65) Prior Publication Data
US 2008/0224049 A1 Sep. 18, 2008

(30) Foreign Application Priority Data
Mar. 12, 2007 (JP) ............... 2007-061399

(51) Int. Cl.
H01L 27/142 (2006.01)
(52) U.S. Cl. .................................. 250/370.09
(58) Field of Classification Search ............ 250/370.01, 250/370.09
See application file for complete search history.

(56) References Cited

U.S. PATENT DOCUMENTS 5,273,910 A * 12/1993 Tran et al. ..................... 438/69
5,818,052 A * 10/1998 Elabd ..................... 250/370.09
5,880,472 A 3/1999 Polischuk et al.
6,124,606 A * 9/2000 den Boer et al. ............. 257/291
6,128,362 A * 10/2000 Brauers et al. ................. 378/28
6,171,643 B1 1/2001 Polischuk et al.
2003/0223534 A1 12/2003 Sato et al.
2006/0027760 A1* 2/2006 Rougeot et al. ......... 250/370.14
2006/0065842 A1* 3/2006 Okamura et al. ....... 250/370.09

FOREIGN PATENT DOCUMENTS

JP 2003-229596 A 8/2003

* cited by examiner

*Primary Examiner*—David P Porta
*Assistant Examiner*—Marcus H Taningco
(74) *Attorney, Agent, or Firm*—Sughrue Mion, PLLC

(57) ABSTRACT

In a planar radiation detector having a substrate; a charge-collection electrode; a radiation-induced-charge conversion film formed mainly of amorphous selenium; and an upper electrode which transmits radiation, or in a planar radiation detector having a substrate; a charge-collection electrode; a light-induced-charge conversion film which is formed mainly of amorphous selenium and generates electric charge when the light-induced-charge conversion film is irradiated with visible light which has passed through an upper electrode; the upper electrode which transmits the visible light emitted from a fluorescent layer; and the fluorescent layer formed of a fluorescent material which converts a radiation carrying image information into the visible light, the radiation-induced-charge conversion film or the light-induced-charge conversion film is formed of amorphous selenium or amorphous selenium alloy and has a residual oxygen concentration of 35 ppm or lower.

16 Claims, 1 Drawing Sheet

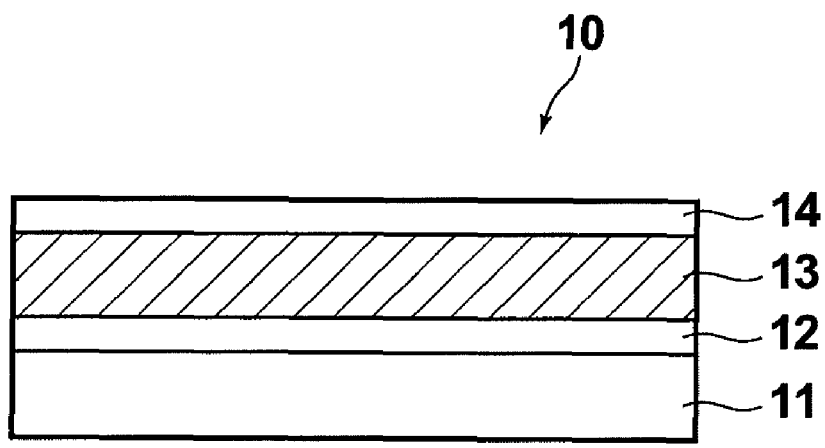
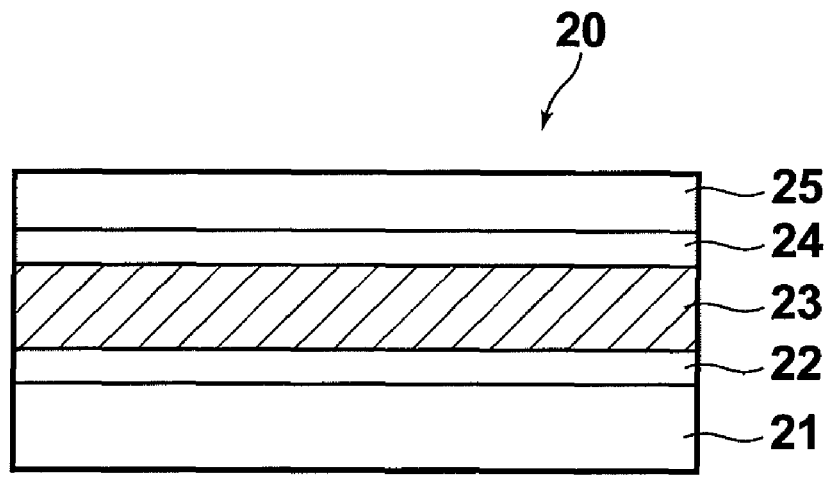

PLANAR RADIATION DETECTOR USING RADIATION-INDUCED-CHARGE CONVERSION FILM OF AMORPHOUS SELENIUM

This is a non-provisional application which claims priority from Japanese patent application No. 061399/2007 filed on Mar. 12, 2007, of which content is incorporated herein by reference.

BACKGROUND OF THE INVENTION

1. Field of the Invention

The present invention relates to a planar radiation detector which uses a radiation-induced-charge conversion film or a light-induced-charge conversion film formed of amorphous selenium.

2. Description of the Related Art

Conventionally, the planar X-ray detector is known to be used in medical X-ray radiography for reducing the exposure dose of a subject and improving diagnostic performance. In the planar X-ray detector, an X-ray-induced-charge conversion film, which is sensitive to X rays, is used, and a distribution of electric charge produced in the X-ray-induced-charge conversion film by X rays is read by use of light or a great number of electrodes for recording the distribution of electric charge. Specifically, the X-ray-induced-charge conversion film is arranged in the planar radiation detector. When the X-ray-induced-charge conversion film is irradiated with X rays, the distribution of electric charge is produced in correspondence with the energy of the X rays, and is then read out in the form of an electric signal. The X-ray-induced-charge conversion film is conventionally made of amorphous selenium (a-Se).

However, in the case where the X-ray-induced-charge conversion film of amorphous selenium is used in a static-image type planar radiation detector such as a mammography system or another radiography system, electrons are trapped by electron traps and a spatial distribution of negative charge is produced in the vicinity of a so-called through region of the X-ray-induced-charge conversion film (i.e., a region of the X-ray-induced-charge conversion film exposed to an extremely high dose of X rays, which is higher than the normal dose by two orders of magnitude), so that a phenomenon called a ghost, in which the sensitivity is lowered, occurs. The ghost is particularly conspicuous in the case where the upper electrode, through which the X rays enter the X-ray-induced-charge conversion film, is negatively biased for protection of TFTs and the like.

Incidentally, the planar radiation detector is a detector which takes radiographic images at intervals of at least 0.3 seconds, and the intensity of X rays incident on the planar radiation detector is normally an order of magnitude higher than the intensity of X rays incident on the moving-image type detector which takes radiographic images at intervals of at least 0.03 seconds.

In addition, another type of planar radiation detector in which a fluorophor converts X rays into visible light, and a thin selenium film is used as a light-induced-charge conversion film is also known. In this type of planar radiation detector, the negative bias is also used for protection of TFTs and the like. Therefore, in this case, the ghost also becomes conspicuous since electrons also mainly move in the light-induced-charge conversion film.

As explained above, the performance of the conventional X-ray-induced-charge conversion film and light-induced-charge conversion film against the ghost is insufficient in the case where the X-ray-induced-charge conversion film and light-induced-charge conversion film are used for taking static images, in particular, when the upper electrode is negatively biased.

For example, Japanese Unexamined Patent Publication No. 2003-229596 discloses an X-ray photoelectric converter in which the halogen concentration in an X-ray-induced-charge conversion film is suppressed to or below 1 ppm for enhancing responsiveness in dynamic X-ray radiography (using concurrent movement of carriers of both polarities) in consideration that halogen causes electron trapping in the X-ray-induced-charge conversion film. However, even when only the halogen concentration is limited, the phenomenon of lowering the sensitivity can still occur according to the lots of raw material.

In addition, U.S. Pat. Nos. 5,880,472 and 6,171,643 discloses an X-ray-induced-charge conversion film made of amorphous selenium doped with As and Cl. In this X-ray-induced-charge conversion film, the phenomenon of lowering the sensitivity can also occur.

Further, U.S. Patent Application Publication No. 20030223534 discloses reduction of electron trapping in a film by doping the film with alkali metal for enhancing responsiveness in dynamic X-ray radiography (using concurrent movement of carriers of both polarities) as Japanese Unexamined Patent Publication No. 2003-229596. However, even when the film is doped with alkali metal, the phenomenon of lowering the sensitivity can still occur according to the lots of raw material.

The present inventors consider that the phenomenon of lowering the sensitivity is greatly related to concurrent movement of both of electrons and positive holes in a film.

SUMMARY OF THE INVENTION

The present invention has been made in view of such circumstances.

The object of the present invention is to provide a planar radiation detector which uses a radiation-induced-charge conversion film or a light-induced-charge conversion film formed of amorphous selenium, and enables improvement of a situation in which the sensitivity of the planar radiation detector is lowered, in particular, when static radiographic images are taken (by using concurrent movement of carriers of both polarities).

In order to accomplish the object, according to the first aspect of the present invention, a planar radiation detector is provided. The planar radiation detector according to the first aspect of the present invention comprises: a substrate; a charge-collection electrode arranged above the substrate; a radiation-induced-charge conversion film formed mainly of amorphous selenium and arranged above the charge-collection electrode; and an upper electrode which transmits radiation and is arranged above the radiation-induced-charge conversion film. The radiation-induced-charge conversion films is formed of amorphous selenium or amorphous selenium alloy and has a residual oxygen concentration of 35 ppm or lower.

In order to accomplish the second object, according to the second aspect of the present invention, another planar radiation detector is provided. The planar radiation detector according to the second aspect of the present invention comprises: a substrate; a charge-collection electrode arranged above the substrate; a light-induced-charge conversion film which is formed mainly of amorphous selenium and arranged above the charge-collection electrode, and generates electric charge when the light-induced-charge conversion film is irradiated with visible light which has passed through an upper electrode; the upper electrode which is arranged above the light-induced-charge conversion film, and transmits the visible light emitted from a fluorescent layer; and the fluorescent layer arranged above the upper electrode and formed of a fluorescent material which converts a radiation carrying image information into the visible light. The light-induced-charge conversion film is formed of amorphous selenium or amorphous selenium alloy and has a residual oxygen concentration of 35 ppm or lower.

In this specification, the unit "ppm" means ppm (part per million) by weight. In addition, the expression "radiation-induced-charge conversion film formed mainly of amorphous selenium" means the weight percentage of amorphous selenium in the radiation-induced-charge conversion film is highest among all the components of the radiation-induced-charge conversion film, and the expression "light-induced-charge conversion film formed mainly of amorphous selenium" means the weight percentage of amorphous selenium in the light-induced-charge conversion film is highest among all the components of the light-induced-charge conversion film. Further, the amorphous selenium alloy is an alloy of amorphous selenium and an element other than selenium.

Preferably, the above planar radiation detectors according to the first and second aspects of the present invention may further comprise one or any possible combination of the following additional features (i) to (x).

(i) The residual oxygen concentration is 15 ppm or lower.

(ii) The amorphous selenium is produced by producing a mixture of high-purity amorphous selenium and a material having bonding strength to oxygen greater than the amorphous selenium and being able to be oxidized to produce an oxide which has a higher vapor pressure than the amorphous selenium, and performing on the mixture at least one of heating and vacuum distillation, and the amorphous selenium alloy is produced by using the amorphous selenium as raw material.

(iii) In the planar radiation detector having the feature (ii), the mixture contains the material with a concentration of 10 to 1,000 ppm before the at least one of heating and vacuum distillation.

(iv) In the planar radiation detector having the feature (ii), the material is arsenic.

(v) In the planar radiation detector having the feature (ii), the material is sulfur.

(vi) In the planar radiation detector having the feature (ii), the heating is performed in inert gas.

(vii) The amorphous selenium is produced by performing heating of high-purity amorphous selenium while blowing reductive gas into the high-purity amorphous selenium, and the amorphous selenium alloy is produced by using the amorphous selenium as raw material.

(viii) In the planar radiation detector having the feature (vii), vacuum distillation is performed on the high-purity amorphous selenium after the heating.

(ix) The halogen concentration in the radiation-induced-charge conversion film or the light-induced-charge conversion film is 1 ppm or lower.

(x) The radiation-induced-charge conversion film or the light-induced-charge conversion film contains alkali metal with a concentration of 0.001 to 10 ppm.

The planar radiation detectors according to the first and second aspects of the present invention have the following advantages.

Since the radiation-induced-charge conversion film in the planar radiation detector according to the first aspect of the present invention and the light-induced-charge conversion film in the planar radiation detector according to the second aspect of the present invention are formed of amorphous selenium or amorphous selenium alloy and have a residual oxygen concentration of 35 ppm or lower, it is possible to prevent the occurrence of the phenomenon (ghost) in which the sensitivity is lowered.

In addition, when the halogen concentration in the radiation-induced-charge conversion film in the planar radiation detector according to the first aspect of the present invention or in the light-induced-charge conversion film in the planar radiation detector according to the second aspect of the present invention is 1 ppm or lower, or when the concentration of alkali metal in the radiation-induced-charge conversion film in the planar radiation detector according to the first aspect of the present invention or in the light-induced-charge conversion film in the planar radiation detector according to the second aspect of the present invention is 0.001 to 10 ppm, the effect of preventing the occurrence of the phenomenon (ghost) in which the sensitivity is lowered is further enhanced.

DESCRIPTION OF THE DRAWINGS

FIG. 1 is a cross-sectional view schematically illustrating an arrangement of a planar radiation detector according to a first embodiment of the present invention.

FIG. 2 is a cross-sectional view schematically illustrating an arrangement of a planar radiation detector according to a second embodiment of the present invention.

DESCRIPTION OF PREFERRED EMBODIMENTS

From the viewpoint of the charge production process for converting radiation into electric charge, the planar radiation detectors include two types, the light conversion type (indirect conversion type) and the direct conversion type. In the light conversion type, when the planar radiation detector is irradiated with a radiation, a fluorescent material emits fluorescence, and a light-induced-charge conversion film detects the fluorescence, produces signal charge in response to the detection, and temporarily holds the signal charge in a charge holding portion. Then, the temporarily held signal charge is converted into an image signal (electric signal), which is outputted from the planar radiation detector. In the direct conversion type, when the planar radiation detector is irradiated with a radiation, a radiation-induced-charge conversion film produces signal charge, and a charge-collection electrode collects the signal charge, and temporarily holds the signal charge in a charge holding portion. Then, the temporarily held signal charge is converted into an image signal (electric signal), which is outputted from the planar radiation detector.

The planar radiation detectors according to the present invention may be either the light conversion type (indirect conversion type) or the direct conversion type as long as the X-ray-induced-charge conversion film or the light-induced-charge conversion film is mainly formed of amorphous selenium. The radiation may be X rays, gamma rays, alpha rays, and the like.

In addition, from the viewpoint of the charge readout process for externally reading out the temporarily held electric charge, the planar radiation detectors include the light readout type and the TFT (thin-film transistor) readout type. In the light readout type, the temporarily held electric charge is read out by irradiating the planar radiation detector with reading light (electromagnetic wave for reading). In the TFT readout type, TFTs are connected to the charge holding portion, and the temporarily held electric charge is read out by driving the TFTs in such a manner that the TFTs are scanned. The planar radiation detectors according to the present invention may be either the light readout type or the TFT readout type.

FIG. 1 is a cross-sectional view schematically illustrating an arrangement of a planar radiation detector according to the first embodiment of the present invention. As illustrated in FIG. 1, the planar radiation detector 10 according to the first embodiment is produced by forming a substrate 11, a charge-collection electrode 12, a radiation-induced-charge conversion film 13, and an upper electrode 14 in this order. That is, the charge-collection electrode 12 is arranged on the substrate 11, the radiation-induced-charge conversion film 13 formed mainly of amorphous selenium and arranged above the charge-collection electrode 12, and the upper electrode 14 is arranged on the radiation-induced-charge conversion film 13. The radiation-induced-charge conversion film 13 is formed mainly of amorphous selenium, and the upper electrode 14 transmits the radiation.

On the other hand, FIG. 2 is a cross-sectional view schematically illustrating an arrangement of a planar radiation detector according to the second embodiment of the present invention. As illustrated in FIG. 2, the planar radiation detector 20 according to the second embodiment is produced by forming a substrate 21, a charge-collection electrode 22, a light-induced-charge conversion film 23, an upper-electrode layer 24, and a fluorescent layer 25 in this order. That is, the charge-collection electrode 22 is arranged on the substrate 21, the light-induced-charge conversion film 23 is arranged on the charge-collection electrode 22, the upper-electrode layer 24 is arranged on the light-induced-charge conversion film 23, and the fluorescent layer 25 is arranged on the upper-electrode layer 24. The light-induced-charge conversion film 23 is formed mainly of amorphous selenium, and generates electric charge when the light-induced-charge conversion film 23 is irradiated with visible light which has been emitted from the fluorescent layer 25 and has passed through the upper-electrode layer 24. The upper-electrode layer 24 transmits the visible light. The fluorescent layer 25 is formed of a fluorescent material which converts a radiation carrying image information into the visible light.

Each of the radiation-induced-charge conversion film 13 in the planar radiation detector 10 illustrated in FIG. 1 and the light-induced-charge conversion film 23 in the planar radiation detector 20 illustrated in FIG. 2 is formed of amorphous selenium or amorphous selenium alloy and has a residual oxygen concentration of 35 ppm or lower, and preferably 15 ppm or lower. When the residual oxygen concentration is higher than 35 ppm, the effect of suppressing the phenomenon in which the sensitivity is lowered is not sufficiently achieved.

In addition, the halogen concentration in each of the radiation-induced-charge conversion film 13 and the light-induced-charge conversion film 23 is preferably 1 ppm or lower. Further, the concentration of alkali metal in each of the radiation-induced-charge conversion film 13 and the light-induced-charge conversion film 23 is preferably 0.001 to 10 ppm, and more is preferably 0.01 to 1 ppm.

The radiation-induced-charge conversion film 13 and the light-induced-charge conversion film 23 formed of amorphous selenium or the amorphous selenium alloy can be produced by producing a mixture of high-purity selenium and a material having bonding strength to oxygen greater than selenium and being able to be oxidized to produce an oxide which has a higher vapor pressure than selenium, and performing on the mixture at least one of heating and vacuum distillation.

The high-purity amorphous selenium means amorphous selenium in which the total concentration of the heavy metals of Te, Mn, Pb, Cr, Sn, Mg, Sb, Si, Ni, Hg, Fe, Bi, Al, Cu, Cd, Ag, Zn, Ti, Ga, As, Ge, In, I, and P is 0.005 weight percent or lower. The concentration of the material having bonding strength to oxygen greater than selenium and being able to be oxidized to produce an oxide which has a higher vapor pressure than selenium is preferably 10 to 1,000 ppm, and more preferably 30 to 300 ppm. When the concentration of this material is lower than 10 ppm, the residual oxygen contained in the high-purity selenium cannot be sufficiently eliminated, so that the effect of suppressing the ghost becomes weak or insufficient. When the concentration of the material having bonding strength to oxygen greater than selenium and being able to be oxidized to produce an oxide which has a higher vapor pressure than selenium is higher than 1,000 ppm, this material remains after the at least one of heating and vacuum distillation, so that unignorable effect appears on the electric characteristics. That is, it is undesirable that the concentration of the above material exceed 1,000 ppm. The material having bonding strength to oxygen greater than selenium and being able to be oxidized to produce an oxide which has a higher vapor pressure than selenium is preferably a reductive agent, and preferable examples of this material are arsenic and sulfur. At this time, the heating of the mixture of the high-purity selenium and the above material is preferably performed in inert gas atmosphere, where the inert gas is, for example, $N_2$ gas, or rare gas (such as helium or argon gas), or a mixture of $N_2$ gas and rare gas. In addition, the heating temperature is preferably 250 to 400° C., and more preferably 280 to 350° C.

Alternatively, the radiation-induced-charge conversion film 13 and the light-induced-charge conversion film 23 formed of amorphous selenium or the amorphous selenium alloy can be produced by performing heating of high-purity selenium while blowing reductive gas into the high-purity selenium. At this time, the reductive gas may be $H_2$, $NH_3$, and the like, and the heating temperature is preferably 250 to 400° C., and more preferably 280 to 350° C. Further, it is preferable to perform vacuum distillation immediately after the heating before the molten selenium is solidified, since a vacuum distillation process which is conventionally performed before the heating (for reducing heavy metal contained as impurities to 0.005 weight percent or less) can be dispensed with in this case.

CONCRETE EXAMPLES OF THE PRESENT INVENTION

In order to confirm the advantages of the present invention, the present inventors have produced concrete examples of the planar radiation detector according to the present invention and some comparison examples, and have measured the oxygen concentrations and the rate of sensitivity decrease, as indicated below.

First Concrete Example of Evaporation Material

First, 500 grams of first high-purity selenium material with the purity of 99.995 weight percent (hereinafter referred to as the selenium material 1-1) and 5 grams of second selenium material containing 10 weight percent of sulfur (S) and 90 weight percent of selenium (Se) (hereinafter referred to as the selenium material 2-1) are prepared. The (high-purity) selenium material 1-1 and the selenium material 2-1 are melted, mixed, and stirred at 300° C. in nitrogen atmosphere, and the molten mixture is heated at 300° C. in open air for five hours. At this time, the sulfur content in the mixture is measured to be 1,000 ppm by weight. Then, the molten mixture is quenched by dropping the molten mixture into ion-exchanged water. Thus, a first concrete example of a material for evaporation (hereinafter referred to as the evaporation material 3-1) is obtained.

Second Concrete Example of Evaporation Material

First, 500 grams of the (high-purity) selenium material 1-1 and the selenium material 2-1 are prepared in a similar manner to the concrete example 1. The selenium material 1-1 and the selenium material 2-1 are melted, mixed, and stirred at 300° C. in nitrogen atmosphere, and the mixture is heated at 300° C. for five hours in a nitrogen gas stream having the flow rate of 1 liter/minute. At this time, the sulfur content in the mixture is measured to be 1,000 ppm by weight. Then, the molten mixture is quenched by dropping the molten mixture into ion-exchanged water. Thus, a second concrete example of a material for evaporation (hereinafter referred to as the evaporation material 3-2) is obtained.

Third Concrete Example of Evaporation Material

First, 500 grams of the high-purity selenium material 1-1 and 5 grams of selenium material containing 10 weight percent of arsenic (As) and 90 weight percent of selenium (Se) (hereinafter referred to as the selenium material 2-2) are prepared. The selenium material 1-1 and the selenium material 2-2 are melted, mixed, and stirred at 300° C. in nitrogen atmosphere, and the molten mixture is heated at 300° C. for five hours in a nitrogen gas stream. At this time, the arsenic content in the mixture is measured to be 1,000 ppm by weight. Then, the molten mixture is quenched by dropping the molten mixture into ion-exchanged water. Thus, a third concrete example of a material for evaporation (hereinafter referred to as the evaporation material 3-3) is obtained.

Fourth Concrete Example of Evaporation Material

First, 500 grams of the (high-purity) selenium material 1-1 and 5 grams of selenium material containing 1 weight percent of arsenic (As) and 99 weight percent of selenium (Se) (hereinafter referred to as the selenium material 2-3) are prepared. The selenium material 1-1 and the selenium material 2-3 are melted, mixed, and stirred at 300° C. in nitrogen atmosphere, and the molten mixture is heated at 300° C. for five hours in a nitrogen gas stream. At this time, the arsenic content in the mixture is measured to be 100 ppm by weight. Then, the molten mixture is quenched by dropping the molten mixture into ion-exchanged water. Thus, a fourth concrete example of a material for evaporation (hereinafter referred to as the evaporation material 3-4) is obtained.

Fifth Concrete Example of Evaporation Material

First, 500 grams of first high-purity selenium material with the purity of 99.995 weight percent (which is obtained from a different lot from the selenium material 1-1, and is hereinafter referred to as the selenium material 1-2) and 5 grams of second selenium material containing 0.1 weight percent of arsenic (As) and 99.9 weight percent of selenium (Se) (hereinafter referred to as the selenium material 2-4) are prepared. The selenium material 1-2 and the selenium material 2-4 are melted, mixed, and stirred at 300° C. in nitrogen atmosphere, and the molten mixture is heated at 300° C. for five hours in a nitrogen gas stream. At this time, the arsenic content in the mixture is measured to be 10 ppm by weight. Then, the molten mixture is quenched by dropping the molten mixture into ion-exchanged water. Thus, a fifth concrete example of a material for evaporation (hereinafter referred to as the evaporation material 3-5) is obtained.

Sixth Concrete Example of Evaporation Material

First, 60 kilograms of the (high-purity) selenium material 1-1 is melted at 300° C., and is then heated at 300° C. for five hours while $H_2$ gas (as the reductive gas) is brown into the molten selenium material 1-1 at the flow rate of 1 liter/minute. Then, the molten mixture is quenched by dropping the molten mixture into ion-exchanged water. Thus, a sixth concrete example of a material for evaporation (hereinafter referred to as the evaporation material 3-6) is obtained.

Seventh Concrete Example of Evaporation Material

First, 60 kilograms of low-purity selenium material with the purity of 99.99 weight percent (hereinafter referred to as the selenium material 1-3) is melted at 300° C., and is then heated at 300° C. for five hours while $H_2$ gas (as the reductive gas) is brown into the molten selenium material 1-3 at the flow rate of 1 liter/minute. Subsequently, vacuum distillation of the molten selenium material 1-3 is performed at 600° C. in a vacuum of 0.1 Pa. Then, the molten mixture is quenched by dropping the molten mixture into ion-exchanged water. Thus, a seventh concrete example of a material for evaporation (hereinafter referred to as the evaporation material 3-7) is obtained. At this time, the concentration of the heavy metals is measured to be 0.005 weight percent.

First Comparison Example of Evaporation Material

The selenium material 1-1 per se is also used as a first comparison example of a material for evaporation.

Second Comparison Example of Evaporation Material

First, 500 grams of the (high-purity) selenium material 1-1 and 5 grams of selenium material containing 0.01 weight percent of arsenic (As) and 99.99 weight percent of selenium (Se) (hereinafter referred to as the selenium material 2-5) are prepared. The selenium material 1-1 and the selenium material 2-5 are melted, mixed, and stirred at 300° C. in nitrogen atmosphere, and the molten mixture is heated at 300° C. for five hours in a nitrogen gas stream. At this time, the arsenic content in the mixture is measured to be 1 ppm by weight. Then, the molten mixture is quenched by dropping the molten mixture into ion-exchanged water. Thus, a second comparison example of a material for evaporation (hereinafter referred to as the evaporation material 3-8) is obtained.

Third Comparison Example of Evaporation Material

First, 500 grams of the (high-purity) selenium material 1-1 and 5 grams of selenium material containing 0.01 weight percent (100 ppm) of sulfur (S) and 99.99 weight percent of selenium (Se) (hereinafter referred to as the selenium material 2-6) are prepared. The selenium material 1-1 and the selenium material 2-6 are melted, mixed, and stirred at 300° C. in nitrogen atmosphere, and the molten mixture is heated at 300° C. for five hours in a nitrogen gas stream. At this time, the sulfur content in the mixture is measured to be 1 ppm by weight. Then, the molten mixture is quenched by dropping the molten mixture into ion-exchanged water. Thus, a third comparison example of a material for evaporation (hereinafter referred to as the evaporation material 3-9) is obtained.

Fourth Comparison Example of Evaporation Material

First, 500 grams of the (high-purity) selenium material 1-1 and 5 grams of the selenium material 2-3 containing 1 weight percent of arsenic (As) and 99 weight percent of selenium (Se) are prepared as in the fourth concrete example. The selenium material 1-1 and the selenium material 2-3 are put in a tube of the PYREX glass, and the tube is vacuum sealed at 0.1 Pa, where PYREX is a registered trademark of Corning Incorporated. Then, a reaction between the selenium material 1-1 and the selenium material 2-3 is caused at 550° C., and the reaction product is quenched before the reaction product is taken out from the tube. Thus, a fourth comparison example of a material for evaporation (hereinafter referred to as the evaporation material 3-10) is obtained.

Production of Planar Radiation Detectors

A selenium or selenium-alloy film (as the radiation-induced-charge conversion film) having a thickness of 200 micrometers is formed by putting each of the evaporation materials obtained in the first to seventh concrete examples and the first to fourth comparison examples in a melting pot and evaporating the evaporation material on an amorphous IZO (indium zinc oxide) layer formed on a square glass plate having the dimensions of 5×5 cm under the conditions that the temperature of the melting pot is 280° C., the degree of vacuum is 0.0001 Pa, the temperature of the substrate is 65° C., and the evaporation rate is 1 micrometer/minute. Thereafter, a planar X-ray detector is produced by forming an upper electrode of gold having a thickness of 60 nm on the upper surface of the selenium film by evaporation.

Measurement of Rate of Sensitivity Decrease

In each planar radiation detector produced as above, a bias voltage of −2 kV is applied to the upper electrode, and an ammeter is connected to the carrier-collection electrode so that the signal current can be read. In this configuration, irradiation of the planar radiation detector with X rays for a duration of 710 milliseconds is repeated ten times at intervals of 15 seconds, where the X rays are emitted under the conditions that the tube voltage is 28 kV, the target is Mo, the tube current is 80 mA, and a Mo filter having a thickness of 30 micrometers is used. The variations in the signal current are recorded, and the ratio of the amount of collected charge during the tenth irradiation to the amount of collected charge during the first irradiation is obtained as the rate of sensitivity decrease.

Measurement of Oxygen Concentration

The oxygen concentrations of the high-purity selenium materials 1-1 and 1-2 and the evaporation materials 3-1 to 3-10 have been measured by pulverizing each material and performing radioactivation analysis using charged particles. In addition, the average oxygen concentration of the radiation-induced-charge conversion film in each planar radiation detector has been measured by pulverization samples of the radiation-induced-charge conversion film and performing radioactivation analysis. The radioactivation analysis uses the nuclear reaction $^{16}O(^{3}He, p)^{18}F$. The half-life of $^{18}F$ is approximately 109 minutes. The accelerator used for causing the nuclear reaction is the cyclotron Cypris 370, manufactured by Sumitomo Heavy Industries, Ltd., Japan. The energy of the incident particle is 13.2 MeV. The energy of the gamma rays emitted from $^{18}F$ is detected by coincidence measurement using two NaI detectors. In the measurement, the irradiation current is 0.1 microamperes, the irradiation time is 20 minutes, and the cooling time is three hours. The produced nuclide is separated by dissolving the reaction product in boric acid $H_3BO_3$, and precipitating $KB^{18}F_4$. The measurement time is 5 minutes. Further, the comparison standard sample is taken from a $SiO_2$ plate. The results of the above measurement are summarized in Table 1.

TABLE 1

| | Se Material Oxygen Concentration (ppm) | Evaporation Material Oxygen Concentration (ppm) | X-ray-induced-charge Conversion Film Oxygen Concentration (ppm) | Rate of Sensitivity Decrease Δ% (Negatively Biased) | Rate of Sensitivity Decrease Δ% (Positively Biased) |
|---|---|---|---|---|---|
| Concrete Example 1 | 60 (Evaporation Material 1-1) | 35 (Evaporation Material 3-1) | 35 | 10 | 8 |
| Concrete Example 2 | 60 (Evaporation Material 1-1) | 25 (Evaporation Material 3-2) | 25 | 8 | 5 |
| Concrete Example 3 | 60 (Evaporation Material 1-1) | 15 (Evaporation Material 3-3) | 15 | 5 | 3 |
| Concrete Example 4 | 60 (Evaporation Material 1-1) | 15 (Evaporation Material 3-4) | 15 | 5 | 3 |
| Concrete Example 5 | 40 (Evaporation Material 1-2) | 30 (Evaporation Material 3-5) | 30 | 8 | 5 |
| Concrete Example 6 | 60 (Evaporation Material 1-1) | 15 (Evaporation Material 3-6) | 15 | 5 | 3 |
| Concrete Example 7 | 60 (Evaporation Material 1-3) | 15 (Evaporation Material 3-7) | 15 | 5 | 3 |

TABLE 1-continued

| | Se Material Oxygen Concentration (ppm) | Evaporation Material Oxygen Concentration (ppm) | X-ray-induced-charge Conversion Film Oxygen Concentration (ppm) | Rate of Sensitivity Decrease Δ% (Negatively Biased) | Rate of Sensitivity Decrease Δ% (Positively Biased) |
|---|---|---|---|---|---|
| Comparison Example 1 | 60 (Evaporation Material 1-1) | 60 (Evaporation Material 1-1) | 60 | 30 | 15 |
| Comparison Example 2 | 60 (Evaporation Material 1-1) | 58 (Evaporation Material 3-8) | 58 | 30 | 15 |
| Comparison Example 3 | 60 (Evaporation Material 1-1) | 58 (Evaporation Material 3-9) | 58 | 30 | 15 |
| Comparison Example 4 | 60 (Evaporation Material 1-1) | 60 (Evaporation Material 3-10) | 60 | 30 | 15 |

As indicated in Table 1, although the lowering of the sensitivity is relatively great in the planar radiation detectors using the evaporation materials as the first to fourth comparison examples, the lowering of the sensitivity is small in the planar radiation detectors using the evaporation materials as the first to seventh concrete examples in both of the cases where the upper electrode is positively and negatively biased. The lowering of the sensitivity is particularly conspicuous in the case where the upper electrodes of the planar radiation detectors using the first to fourth comparison examples are negatively biased. That is, the measurement results indicate that the oxygen concentrations of the radiation-induced-charge conversion films greatly affect the electron mobility.

Although the oxygen concentrations have been measured as above by radioactivation analysis, alternatively, the oxygen concentrations may be measured by SIMS (secondary ion mass spectrometry). Even in the case where SIMS is used, it is important to measure the average oxygen concentration in the entire radiation-induced-charge conversion film. For example, even when the oxygen concentration exceeds 35 ppm at the depth of approximately 1 micrometer from the interface, the high oxygen concentration in only the limited region of the radiation-induced-charge conversion film does not greatly affect the production of the X-ray-induced charge.

Effect of Low Halogen

In addition, in order to confirm the effect of the suppression of the halogen content in the radiation-induced-charge conversion film, the present inventors have produced a further concrete example and a further comparison example of the evaporation materials, and have measured the concentrations of oxygen and halogen (chlorine) and the rate of sensitivity decrease, as indicated below.

Vacuum distillation is performed on the selenium material 3-4 (obtained as the fourth concrete example) in a similar manner to the seventh concrete example so as to obtain an eighth concrete example of a material for evaporation (hereinafter referred to as the evaporation material 3-11) in which the concentration of halogens (including Cl, Br, and I) is 0.1 to 0.7 ppm.

A fifth comparison example of a material for evaporation (hereinafter referred to as the evaporation material 3-12) is produced by doping the selenium material 3-4 with 2 ppm of chlorine. The fifth comparison example is produced for indicating the effect of the suppression of the halogen content, and the planar X-ray detector having a selenium-alloy film formed by using the evaporation material 3-12 as the fifth comparison example is also within the scope of the present invention.

In addition, a planar X-ray detector having a selenium-alloy film formed by using each of the evaporation materials 3-11 and 3-12 as described in the section "Production of Planar Radiation Detectors" is produced, and the rate of sensitivity decrease of each planar X-ray detector and the oxygen concentration of each selenium-alloy film have been measured. In addition, the chlorine concentration of each selenium-alloy film has been measured in the following steps (1) to (3).

(1) Dissolve the selenium-alloy film in hot nitric acid, and extract chlorine gas.

(2) Cause a reaction between the chlorine gas with a silver nitrate solution, and precipitate silver chloride from the solution.

(3) Collect the precipitated silver chloride by filtering, and measure the quantity of the collected silver chloride to determine the chlorine concentration.

The results of the above measurement are indicated in Table 2.

TABLE 2

| | Evaporation Material | | X-ray-induced-charge Conversion Film | | Rate of Sensitivity Decrease | Rate of Sensitivity Decrease |
|---|---|---|---|---|---|---|
| | Oxygen Concentration (ppm) | Chlorine Concentration (ppm) | Oxygen Concentration (ppm) | Chlorine Concentration (ppm) | Δ% (Negatively Biased) | Δ% (Positively Biased) |
| Concrete Example 8 | 15 | 1.4 | 15 | 0.7 | 3 | 1 |

TABLE 2-continued

|  | Evaporation Material | | X-ray-induced-charge Conversion Film | | Rate of Sensitivity Decrease | Rate of Sensitivity Decrease |
| --- | --- | --- | --- | --- | --- | --- |
|  | Oxygen Concentration (ppm) | Chlorine Concentration (ppm) | Oxygen Concentration (ppm) | Chlorine Concentration (ppm) | Δ% (Negatively Biased) | Δ% (Positively Biased) |
| Comparison Example 5 | 15 | 3 | 15 | 1.5 | 8 | 5 |

As indicated in Table 2, when the oxygen concentration is suppressed to or below 15 ppm, and the chlorine concentration is suppressed to or below 1 ppm, the lowering of the sensitivity can be further reduced in both of the cases where the upper electrode is positively and negatively biased.

Effect of Alkali-Metal Doping

Further, in order to confirm the effect of the alkali-metal doping in the radiation-induced-charge conversion film, the present inventors have produced further concrete examples and a further comparison example of the evaporation materials, and the concentrations of oxygen and alkali metal (sodium) and the rate of sensitivity decrease have been measured, as indicated below.

A ninth concrete example of a material for evaporation (hereinafter referred to as the evaporation material 3-13) is produced by doping the selenium material 3-4 with 10 ppm of sodium.

In addition, a tenth concrete example of a material for evaporation (hereinafter referred to as the evaporation material 3-14) is produced by doping the selenium material 3-4 with 100 ppm of sodium.

Further, the selenium material 3-4 per se is also used as a sixth comparison example of a material for evaporation. The sodium content in the selenium material 3-4 is measured to be 0.5 ppm or less. The sixth comparison example is produced for indicating the effect of the suppression of the halogen content, and the planar X-ray detector having a selenium-alloy film formed by using the evaporation material 3-4 as the sixth comparison example is also within the scope of the present invention.

A planar X-ray detector having a selenium-alloy film formed by using each of the evaporation materials 3-13 and 3-14, and 3-4 as described in the section "Production of Planar Radiation Detectors" is produced, and the rate of sensitivity decrease of each planar X-ray detector and the oxygen concentration of each selenium-alloy film have been measured. In addition, the sodium concentration of each selenium-alloy film has been measured in the following steps (1) and (2).

(1) In order to measure the sodium concentration, a selenium-alloy film is formed by concurrently performing evaporation of each of the evaporation materials 3-13 and 3-14, and 3-4 (as the ninth and tenth concrete examples and the sixth comparison example) on a silicon substrate (wafer) and the aforementioned amorphous IZO layer formed on the square glass plate having the dimensions of 5×5 cm).

(2) All the selenium contained in each selenium-alloy film is dissolved in nitric acid, the selenium content in the solution is determined by ICP (inductively coupled plasma) atomic emission spectrometry, and the sodium content in the solution is determined by graphite-furnace atomic absorption spectrometry. Thus, the sodium concentration relative to the selenium content is obtained.

The results of the above measurement are indicated in Table 3.

TABLE 3

|  | Evaporation Material | | X-ray-induced-charge Conversion Film | | Rate of Sensitivity Decrease | Rate of Sensitivity Decrease |
| --- | --- | --- | --- | --- | --- | --- |
|  | Oxygen Concentration (ppm) | Sodium Concentration (ppm) | Oxygen Concentration (ppm) | Sodium Concentration (ppm) | Δ% (Negatively Biased) | Δ% (Positively Biased) |
| Concrete Example 9 | 15 | 10 | 15 | 0.01 | 2 | 1 |
| Concrete Example 10 | 15 | 100 | 15 | 1 | 2 | 1 |
| Comparison Example 6 | 15 | 0.5 or less | 15 | 0.0003 or less | 5 | 3 |

As indicated in Table 3, when the oxygen concentration is suppressed to or below 15 ppm, and the radiation-induced-charge conversion film is doped with 0.001 to 10 ppm alkali metal, the lowering of the sensitivity can be further reduced in both of the cases where the upper electrode is positively and negatively biased.

As explained above, since the radiation-induced-charge conversion film and the light-induced-charge conversion film in the planar radiation detectors according to the present invention are formed of amorphous selenium or amorphous selenium alloy and have a residual oxygen concentration of 35 ppm or lower, it is possible to prevent the occurrence of the phenomenon in which the sensitivity is lowered.

What is claimed is:

1. A planar radiation detector comprising:
a substrate;
a charge-collection electrode arranged above said substrate;

a radiation-induced-charge conversion film formed mainly of amorphous selenium and arranged above said charge-collection electrode; and an upper electrode which transmits radiation and is arranged above said radiation-induced-charge conversion film;

wherein said radiation-induced-charge conversion film is formed of amorphous selenium or amorphous selenium alloy and has a residual oxygen concentration of 35 ppm or lower.

2. A planar radiation detector according to claim 1, wherein said residual oxygen concentration is 15 ppm or lower.

3. A planar radiation detector according to claim 1, wherein said radiation-induced-charge conversion film contains halogen at a concentration of 1 ppm or lower.

4. A planar radiation detector according to claim 1, wherein said radiation-induced-charge conversion film contains alkali metal at a concentration of 0.001 to 10 ppm.

5. A planar radiation detector comprising:
a substrate;
a charge-collection electrode arranged above said substrate;
a light-induced-charge conversion film which is formed mainly of amorphous selenium and arranged above said charge-collection electrode, and generates electric charge when the light-induced-charge conversion film is irradiated with visible light which has passed through an upper electrode; and
said upper electrode which is arranged above said light-induced-charge conversion film, and transmits said visible light emitted from a fluorescent layer; and said fluorescent layer arranged above said upper electrode and formed of a fluorescent material which converts a radiation carrying image information into said visible light;
wherein said light-induced-charge conversion film is formed of amorphous selenium or amorphous selenium alloy and has a residual oxygen concentration of 35 ppm or lower.

6. A planar radiation detector according to claim 5, wherein said residual oxygen concentration is 15 ppm or lower.

7. A planar radiation detector according to claim 5, wherein said amorphous selenium or amorphous selenium alloy is produced by producing a mixture of high-purity amorphous selenium and a material having bonding strength to oxygen greater than the amorphous selenium and being able to be oxidized to produce an oxide which has a higher vapor pressure than the amorphous selenium, and performing on the mixture at least one of heating and vacuum distillation.

8. A planar radiation detector according to claim 7, wherein said mixture contains said material with a concentration of 10 to 1,000 ppm before said at least one of heating and vacuum distillation.

9. A planar radiation detector according to claim 7, wherein said material is arsenic.

10. A planar radiation detector according to claim 7, wherein said material is sulfur.

11. A planar radiation detector according to claim 7, wherein said heating is performed in inert gas.

12. A planar radiation detector according to claim 5, wherein said amorphous selenium or amorphous selenium alloy is produced by performing heating of high-purity amorphous selenium while blowing reductive gas into the high-purity amorphous selenium.

13. A planar radiation detector according to claim 12, wherein vacuum distillation is performed on said high-purity amorphous selenium after said heating.

14. A planar radiation detector according to claim 5, wherein said light-induced-charge conversion film contains halogen with a concentration of 1 ppm or lower.

15. A planar radiation detector according to claim 5, wherein said light-induced-charge conversion film contains alkali metal with a concentration of 0.001 to 10 ppm.

16. A planar radiation detector comprising:
a substrate;
a charge-collection electrode arranged above said substrate;
a charge conversion film which is formed mainly of amorphous selenium and arranged above said charge-collection electrode, wherein the charge conversion film is light-induced charge conversion film or radiation-induced charge conversion film; and
an upper electrode which is arranged above said charge conversion film, and transmits the radiation or visible light,
wherein said charge conversion film is formed of amorphous selenium or amorphous selenium alloy and has a residual oxygen concentration of 35 ppm or lower.

* * * * *